United States Patent [19]
Kitaguro et al.

[11] Patent Number: 6,107,161
[45] Date of Patent: Aug. 22, 2000

[54] SEMICONDUCTOR CHIP AND A METHOD FOR MANUFACTURING THEREOF

[75] Inventors: Koichi Kitaguro; Hiroshi Kadonishi, both of Kyoto, Japan

[73] Assignee: Rohm Co., Ltd., Kyoto, Japan

[21] Appl. No.: 09/019,896

[22] Filed: Feb. 6, 1998

Related U.S. Application Data

[63] Continuation of application No. PCT/JP97/01935, Jun. 6, 1997.

[30] Foreign Application Priority Data

Jun. 7, 1996 [JP] Japan ..................................... 8-145415

[51] Int. Cl.⁷ ..................................................... H01L 21/46
[52] U.S. Cl. .......................... 438/462; 438/113; 438/460
[58] Field of Search ..................... 438/113, 460, 438/461, 462, 463, 464, 465

[56] References Cited

U.S. PATENT DOCUMENTS

| | | | |
|---|---|---|---|
| 4,355,457 | 10/1982 | Barlett et al. | 434/460 |
| 4,610,079 | 9/1986 | Abe et al. | 438/462 |
| 5,157,001 | 10/1992 | Sakuma | 438/465 |
| 5,213,994 | 5/1993 | Fuchs | 438/462 |
| 5,899,729 | 5/1999 | Lee | 438/113 |
| 5,943,591 | 8/1999 | Vokoun et al. | 438/462 |

FOREIGN PATENT DOCUMENTS

| | | |
|---|---|---|
| 56-103447 | 8/1981 | Japan . |
| 62-14440 | 1/1987 | Japan . |
| 62-26839 | 2/1987 | Japan . |
| 62-186569 | 8/1987 | Japan . |
| 64-18733 | 1/1989 | Japan . |
| 5-136261 | 6/1993 | Japan . |

*Primary Examiner*—Kevin M. Picardat
*Attorney, Agent, or Firm*—Merchant & Gould P.C.

[57] ABSTRACT

It is an object of the present invention to provide a semiconductor chip which is hard to be damaged when the semiconductor chip is cut out from a sheet of wafer for semiconductor and a method for manufacturing thereof. Cutting grooves 26 having a wider width than scribing lines (lines for carrying out scribing) 24 which is cut by a dicing saw are formed on the upper part of the wafer 20. That is, walls 32 of the cutting grooves 26 are set back from cutting planes 30 in side walls 28 of die 22 thus cut out. So that, there is only a slight probability of contact of the dicing saw with the walls 32 of the cutting grooves 26 when the wafer 20 is cut along the center of the cutting grooves 26 with the dicing saw. As a result, it is possible to prevent chips of the upper part of the dies 22 caused by a blade of the dicing saw.

3 Claims, 16 Drawing Sheets

20:WAFER
22:DIE
24:SCRIBING LINES
26:CUTTING GROOVES
28:SIDE WALLS OF DIE
30:CUTTING PLANES
32:WALLS OF CUTTING GROOVES

SEMICONDUCTOR CHIP AND A METHOD FOR MANUFACTURING THEREOF

This application is a Continuation of application Ser. No. PCT/JP97/01935, filed Jun. 6, 1997, which application(s) are incorporated herein by reference.

FIELD OF THE INVENTION

The present invention relates to a semiconductor chip, and more specifically to a technique for cutting out a plurality of semiconductor chips from a semiconductor wafer.

BACKGROUND ART

A technique for cutting out a plurality of dies (semiconductor chips) from a sheet of wafer having semiconductor elements on it by utilizing a dicing saw or similar equipment is known to the public. Both FIG. 14A and FIG. 14B show views of processes for cutting out the dies from the wafer (when "full cutting method" is carried out). At first, a plastic film 4 coated with adhesive on a surface is attached under the wafer 2 as shown in FIG. 14A. Then, the wafer 2 is cut completely with the dicing saw 6. Thus, a plurality of dies 8 can be cut out from the sheet of wafer 2 (see FIG. 15).

However, the cutting method described above has the following problems to be resolved. A part of the dies 8 might be chipped by the dicing saw 6 when the cutting method is carried out. Especially, corners 8a of the dies 8 located at vicinity of intersection points 14 where lines for scribing (hereinafter referred to as scribing lines) intersect are chipped often as shown in FIG. 15. The scribing lines consist of longitudinal lines 10 extended to a longitudinal direction and transverse lines 12 extended to a transverse direction.

As shown in FIG. 16, water resistance and other advantageous features of the dies 8 are destroyed by damaging a protection layer 16 such as crack or similar phenomena caused by chips caused at the corners 8a when upper part of the dies 8 are covered with the protection layer 16 made of silicon nitride layer (SiN) or a material having similar chemical formula.

The problems described earlier clearly appear when spaces being formed between dies 8 located adjacently are made under a narrower width in order to cut out as many as dies 8 possible from the wafer 2. In other words, these problems appear when margins of the scribing lines are narrower than usual.

DISCLOSURE OF THE PRESENT INVENTION

It is an object of the present invention to provide a semiconductor chip which is hard to be damaged when the semiconductor chip is cut out from a sheet of wafer for semiconductor and a method for manufacturing thereof.

The semiconductor chip of claim 1 is characterized in that, the semiconductor chip comprises a plurality of side faces having cutting planes formed substantially flat, wherein the cutting planes are formed when the semiconductor chip is cut out from a wafer for semiconductor, and set back faces located at positions substantially set back from the cutting planes are formed on the side faces.

Also, the semiconductor chip of claim 2 in accordance with claim 1 is characterized in that an amount of set-back from the cutting plane to the set back the faces in vicinity of an intersection of the side faces is made larger than an amount of the set-back from the cutting plane to the set back faces in a part located apart from vicinity of the intersection of the side faces.

Further, the semiconductor chip of claim 3 in accordance with claim 1 is characterized in that an amount of set-back from the cutting plane to the set back faces in the vicinity of an intersection of the side faces is made substantially equivalent to an amount of the set-back from the cutting plane to the set back faces in a part located apart from vicinity of the intersection of the side faces.

Still further, the semiconductor chip of claim 4 in accordance with claim 1 is characterized in that, the set back faces are formed all around the side faces.

Yet further, the semiconductor chip of claim 5 in accordance with claim 1 is characterized in that the set back face is formed only in vicinity of the intersection of the side faces.

The semiconductor chip of claim 6 in accordance with claim 1 is characterized in that the shape of the set back faces located in the vicinity of the intersection of the side faces are formed substantially in circular arc shape in observation from an upper part of the wafer for semiconductor.

Also, the semiconductor chip of claim 7 in accordance with claim 1 is characterized in that the semiconductor chip comprises a planar transistor.

Further, the method for manufacturing a semiconductor chip of claim 8 is characterized in that the method has a process for cutting out the semiconductor chip from a wafer for semiconductor, wherein a process for forming cutting grooves having wider width than a cutting trace made by a cut-off tool is carried out to a part of the wafer for semiconductor to be cut off before carrying out the process for cutting out the semiconductor chip from the wafer for semiconductor.

Still further, the method for manufacturing a semiconductor chip of claim 9 in accordance with claim 8 is characterized in that width of the cutting grooves located in vicinity of an intersection of the cutting grooves is made wider than width of the cutting grooves that is formed apart from vicinity of the intersection of the cutting grooves.

Yet further, the method for manufacturing a semiconductor chip of claim 10 in accordance with claim 9 is characterized in that the cutting grooves are formed by carrying out etching using a resist layer expanded by heat treatment as a mask, and a resist layer before the expansion is used at a process carried out before the process for forming the cutting grooves, and wherein parts of the pattern of the resist layer used at the process carried out before the process for forming the cutting grooves corresponded to outlines of the cutting grooves intersected with each other are connected smoothly.

The method for manufacturing a semiconductor chip of claim 11 in accordance with claim 8 is characterized in that semiconductor elements which compose the semiconductor chip are arranged so as to be in the vicinity and at the inside of the cutting grooves of the semiconductor chip.

Also, the method for manufacturing a semiconductor chip of claim 12 in accordance with claim 9 is characterized in that semiconductor elements which compose the semiconductor chip are arranged so as to be in the vicinity and at the inside of the cutting grooves of the semiconductor chip.

Further, the method for manufacturing a semiconductor chip of claim 13 in accordance with claim 10 is characterized in that semiconductor elements which compose the semiconductor chip are arranged so as to be in the vicinity and at the inside of the cutting grooves of the semiconductor chip.

Still further, the method for manufacturing a semiconductor chip of claim 14 in accordance with claim 10 is characterized in that the parts of the pattern of the resist layer used at the process carried out immediately before the process for forming the cutting grooves corresponded to the outlines of the cutting grooves intersected with each other are connected in shape of a substantially circular arc.

Yet further, the method for manufacturing a semiconductor chip of claim 15 in accordance with claim 8 is characterized in that the semiconductor chip is a chip having a planar transistor.

The semiconductor chip in claim 1 and the methods for manufacturing a semiconductor chip in claim 8 are characterized in that the set back faces substantially set back from the cutting planes are formed on the side faces.

So that, a cut-off tool is never touched with the set back face when the semiconductor chip is cut out from the wafer. Thus, the set back faces are not damaged by the cut-off tool. That is, it is possible to realize a semiconductor chip which is hard to be damaged by providing the set back faces to parts having a higher probability of being damaged.

The semiconductor chip in claim 2 and the methods for manufacturing a semiconductor chip in claim 9 are characterized in that an amount of set-back in the vicinity of an intersection of the side faces is made larger than an amount of the set-back at a position apart from the vicinity of the intersection of the side faces.

So that, a larger amount of the set-back is provided to the corners of the dies where it is easy to be chipped during cutting off the semiconductor chip from the wafer. As a result, it is possible to realize a semiconductor chip which is hard to be damaged.

The method for manufacturing a semiconductor chip in the claim 10 is characterized in that parts of the pattern of the resist layer used at the process carried out before the process for forming the cutting grooves corresponded to outlines of the cutting grooves intersected with each other are connected smoothly.

So that, the parts of the pattern of the resist layer smoothly connected with each other are expanded uniformly when the resist layer is heated. Thus, the outlines of the cutting grooves located at the intersection are formed smoothly without forming sharp edges when the expanded resist layer is used as a mask for etching at the process for forming cutting grooves. As a result, a larger amount of set-back can be obtained reliably.

The methods for manufacturing a semiconductor chip in the claim 11, claim 12 and claim 13 are characterized in that semiconductor elements which compose the semiconductor chip are arranged so as to be in the vicinity and at the inside of the cutting grooves of the semiconductor chip.

So that, the amount of the set-back and the location of the set back faces are not restricted by the existence of the semiconductor elements arranged at the inside of the cutting grooves. As a result, the set back faces can be formed in an appropriate size at a right place.

While the novel features of the invention are set forth in a general fashion, both as to organization and content, it will be better understood and appreciated, along with other objects and features thereof, from the following detailed description taken in conjunction with the drawings.

THE BEST MODE OF PREFERRED EMBODIMENT TO CARRY OUT THE PRESENT INVENTION

Figure 1:
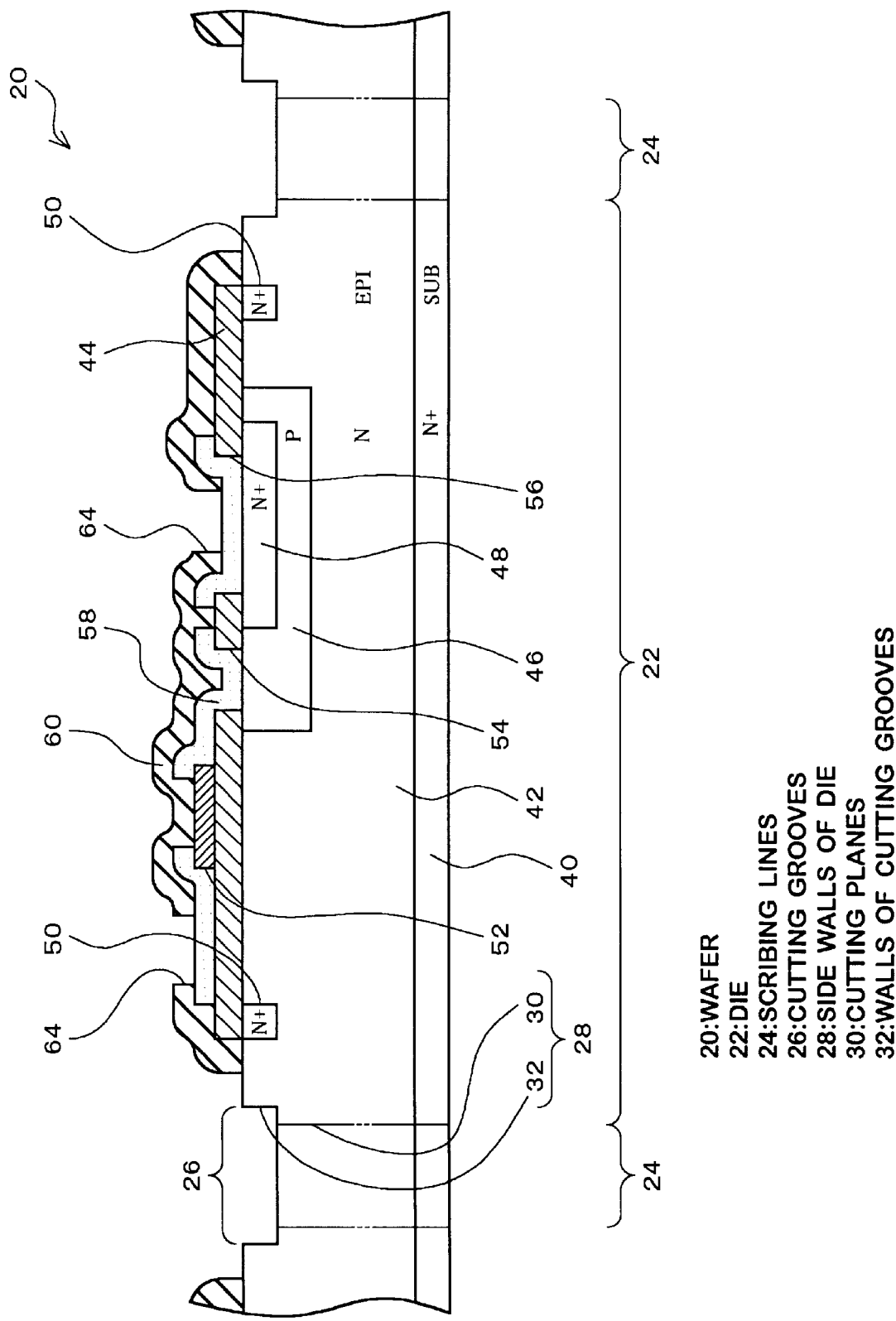
FIG. 1 is a sectional view showing a die 22 of a planar transistor as a semiconductor chip in an embodiment of the present invention.

FIG. 1 is a sectional view of a die 22 of a planar transistor as a semiconductor chip in an embodiment of the present invention. FIG. 1 shows a condition of the die 22 before cutting out from a semiconductor wafer 20. Thereafter, the wafer 20 is cut with a dicing saw (not shown) for dicing. A plurality of cutting grooves 26 having a wider width than scribing lines 24 which is cut by dicing saw are formed on the upper part of the wafer 20.

So that, side walls 28 of the die 22 divided at the scribing lines 24 consist of cutting planes 30 being formed approximately flat by cutting of the dicing saw and walls 32 being formed within the cutting grooves 26. In this embodiment, the walls 32 correspond to set back faces. In other words, the walls 32 of the cutting grooves 26 are set back from the cutting planes 30.

Figure 2:
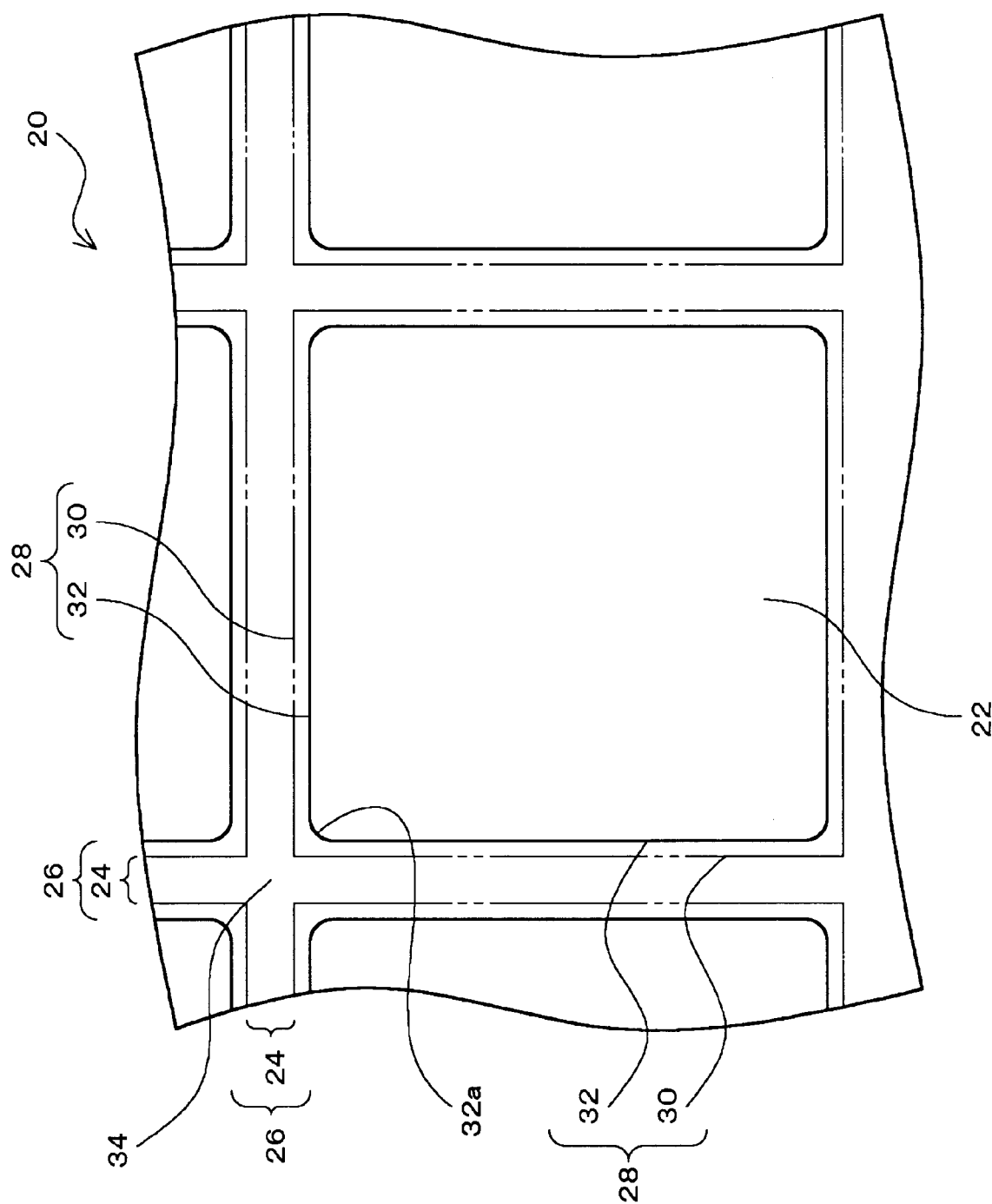
FIG. 2 is a plan view (schematic illustration) of a wafer 20 shown in FIG. 1.

FIG. 2 is a plan view (schematic illustration) of the wafer 20 shown in FIG. 1. As shown in FIG. 2, the die 22 is surrounded by a total of four side walls 28 each of which having the structure described earlier. Further, the walls 32 formed within the cutting grooves 26 being intersected with each other are connected at connection parts 32a located at vicinity of intersections 34. In this embodiment, the connection parts 32a are formed in a circular arc shape.

Next, manufacturing processes of the planar transistor are described hereunder in accordance with FIG. 1 to FIG. 13B. FIG. 3 to FIG. 9 are plan views showing a part of the manufacturing processes of the planar transistor formed on the wafer 20. FIG. 10 is a partial enlarged plan view of the wafer 20 in a part of the manufacturing processes. FIG. 11A to FIG. 13B are sectional views of the wafer 20 in a part of the manufacturing processes.

At first, an N type substrate 40 having both an epitaxial growth layer 42 and a silicon oxidation layer ($SiO_2$) 44 on its surface in that order is prepared as shown in FIG. 1.

Figure 3:
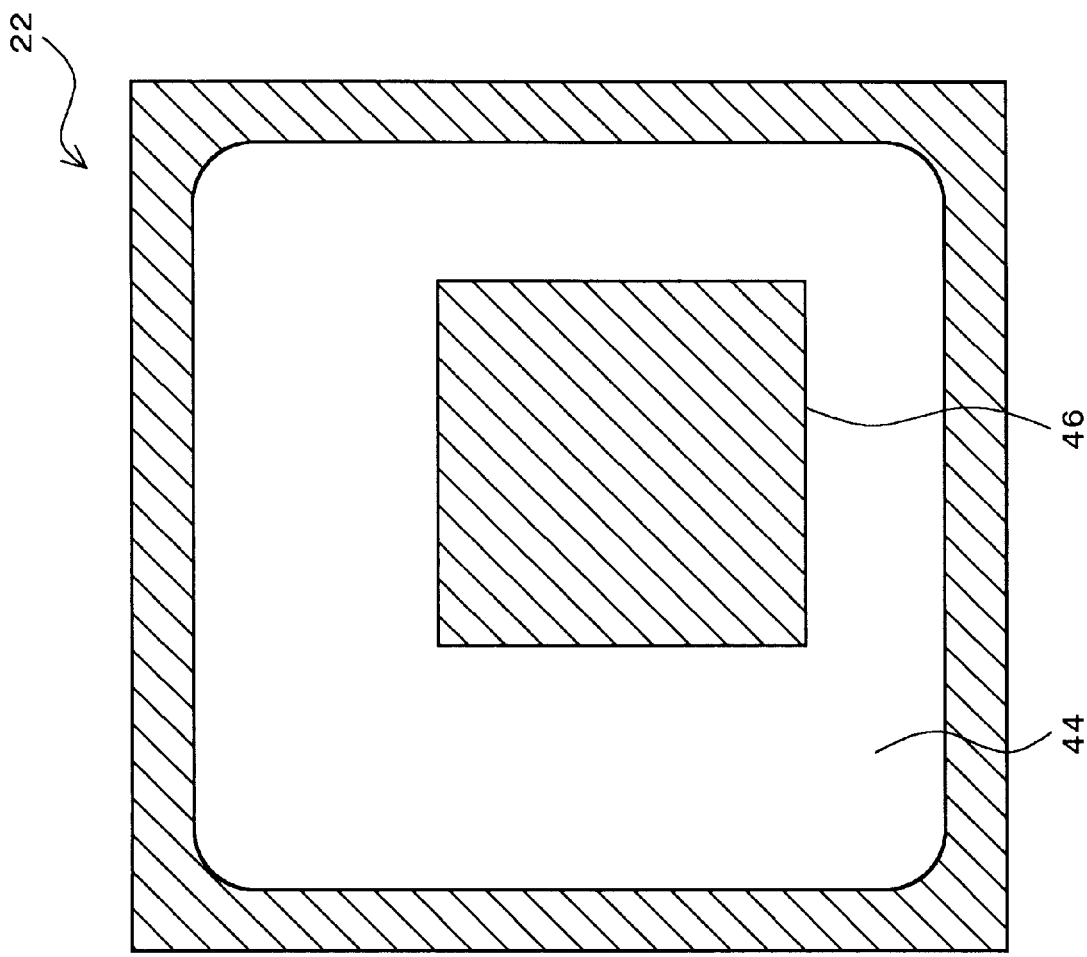
FIG. 3 is a plan view showing a part of the manufacturing processes of the planar transistor formed on the wafer 20.

Next, only slash lined parts are removed from the silicon oxidation layer ($SiO_2$) 44 by etching as shown in FIG. 3. The etching is carried out by masking all the parts excluding the slash lined parts with a resist layer. After carrying out the etching, the resist layer is removed. Then, thermal diffusion of boron is carried out by utilizing the remaining silicon oxidation layer 44 (excluding the slash lined part) as a mask. Thus, a base region 46 is formed.

Figure 4:
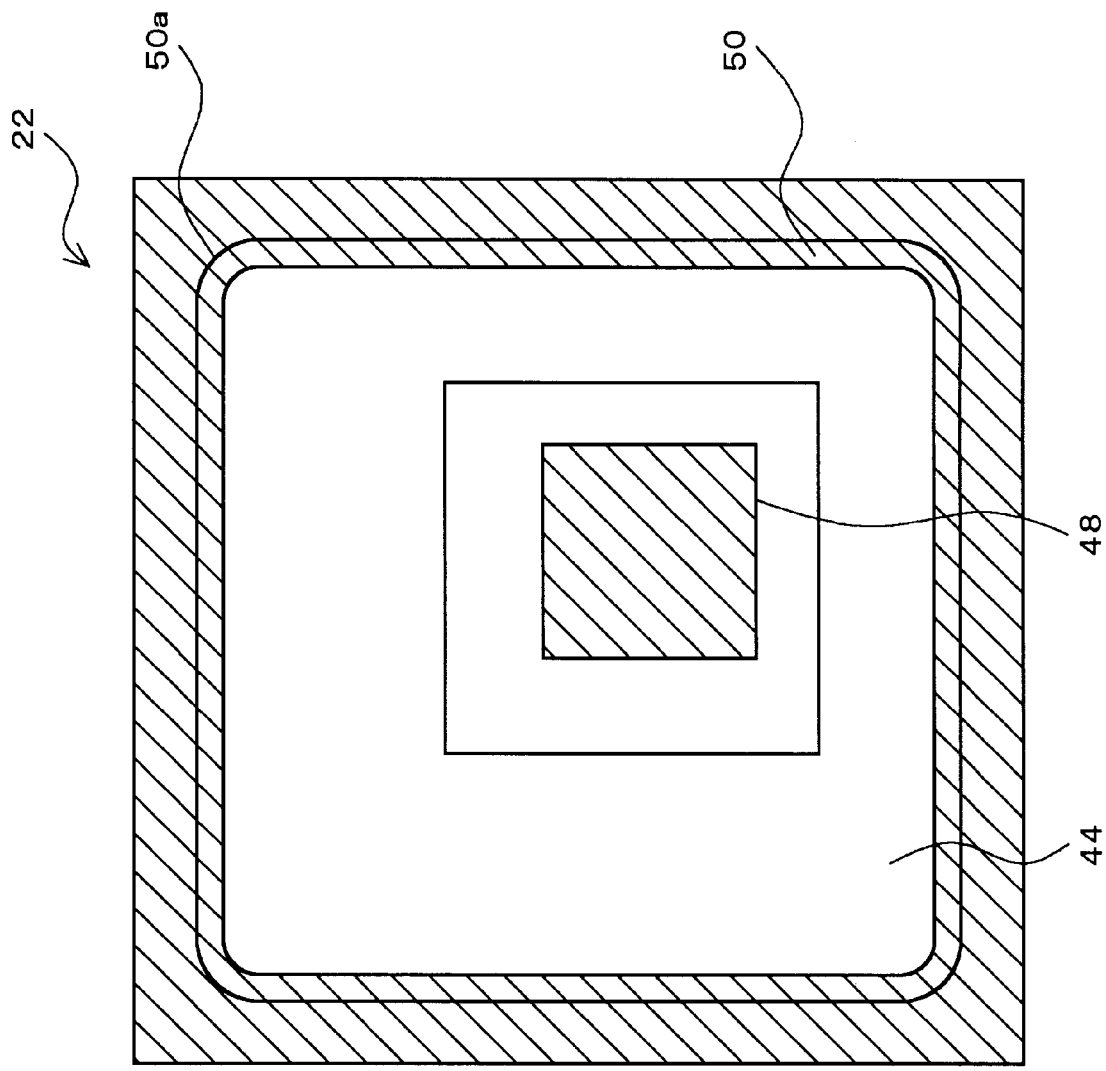
FIG. 4 is a plan view showing another part of the manufacturing processes of the planar transistor formed on the wafer 20.

Thereafter, another silicon oxidation layer 44 is formed on the surface of the wafer 20, and an emitter region 48 is formed as shown in FIG. 4 by similar procedures of forming the base region 46 described earlier. In this case, phosphor is used for carrying out thermal diffusion instead of boron. A guard ring 50 is formed during the thermal diffusion process. The guard ring 50 is formed so as to encircle the planar transistor element in order to prevent generation of current leakage in the surface of the semiconductor chip. In this embodiment, corners 50a of the guard ring 50 are formed in a circular arc shape.

Figure 5:
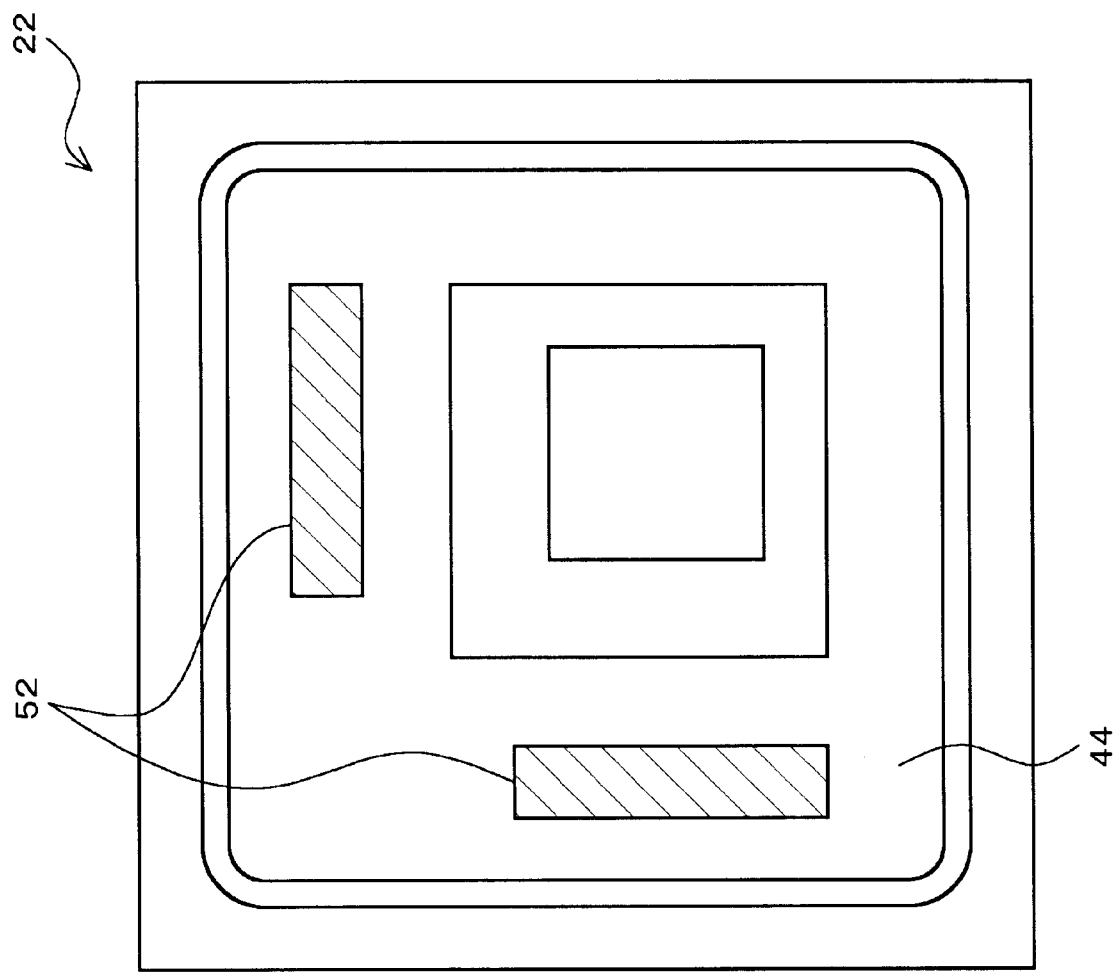
FIG. 5 is a plan view showing far another part of the manufacturing processes of the planar transistor formed on the wafer 20.

Next, a plurality of resistances 52 made of polysilicon (slash lined parts) are formed as shown in FIG. 5. In other words, far another silicon oxidation layer 44 is formed on the surface of the wafer 20, and polysilicon is deposited thereon. The resistances 52 are formed by carrying out patterning of the polysilicon thus deposited.

Figure 6:
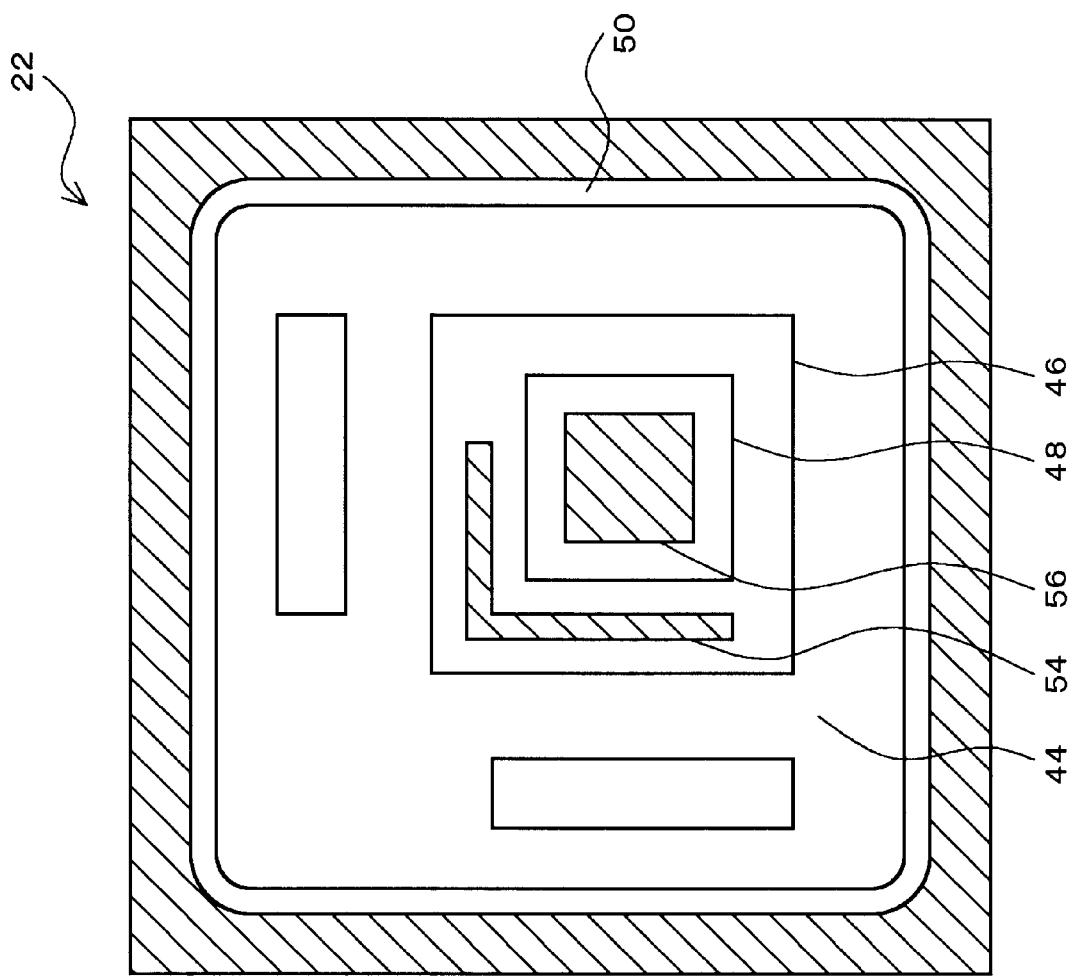
FIG. 6 is a plan view showing still another part of the manufacturing processes of the planar transistor formed on the wafer 20.

Then, contact holes 54 and 56 are formed by removing a part of the silicon oxidation layer 44 formed on both the upper part of the base region 46 and the emitter region 48 by etching as shown in FIG. 6. The silicon oxidation layer 44 located around the guard ring 50 is also removed during the etching process. So that, the parts shown in slash lines are the parts removed from the silicon oxidation layer 44 during the etching process.

Figure 7:
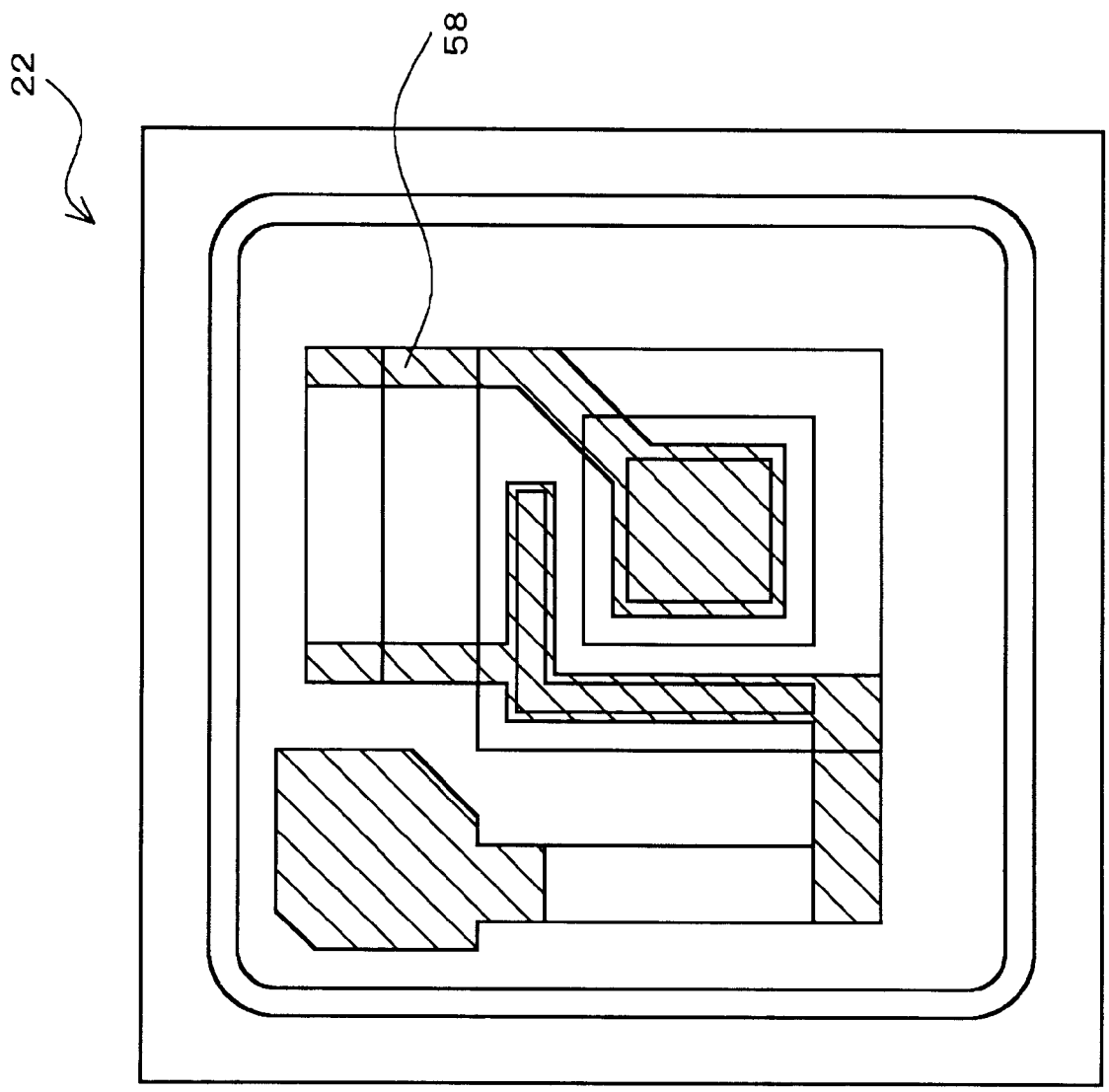
FIG. 7 is a plan view showing another part of the manufacturing processes of the planar transistor formed on the wafer 20.

Thereafter, aluminum wirings 58 are formed on the slash lined parts as shown in FIG. 7. The aluminum wirings 58 are deposited by forming an aluminum layer on the surface of the wafer 20 utilizing vacuum evaporation technique or similar technique and then carrying out patterning of the aluminum layer by etching technique.

Figure 11A:
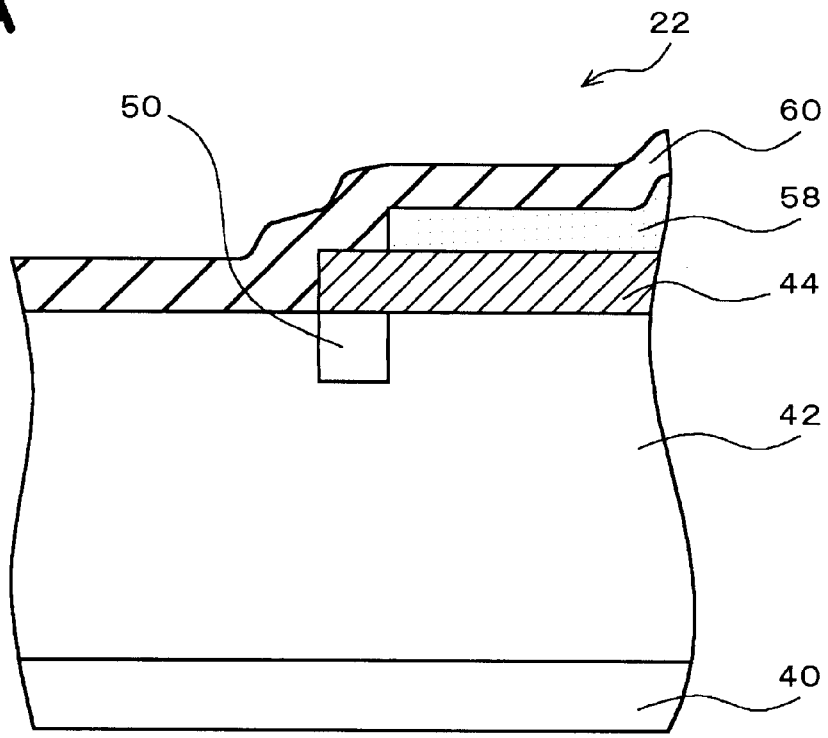
FIG. 11A is a sectional view of the wafer 20 in a part of the manufacturing processes.
Figure 11B:
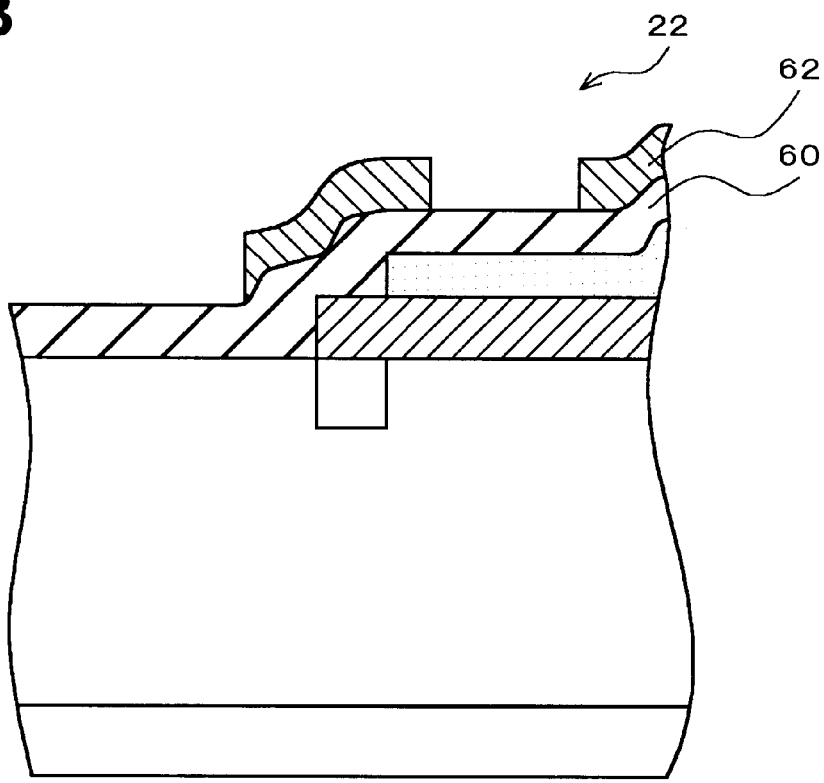
FIG. 11B is a sectional view of the wafer 20 in another part of the manufacturing processes.

Next, a silicon nitride (SiN) layer 60 is formed on the surface of the wafer 20 as a protection layer using CVD (Chemical Vapor Deposition) technique or similar technique as shown in FIG. 11A, and another resist layer 62 is formed on the silicon nitride layer 60 thus formed by carrying out patterning as shown in FIG. 11B. Upon forming the resist layer 62, a part of the silicon nitride layer 60 is removed by etching utilizing the resist layer 62 as a mask.

Figure 8:
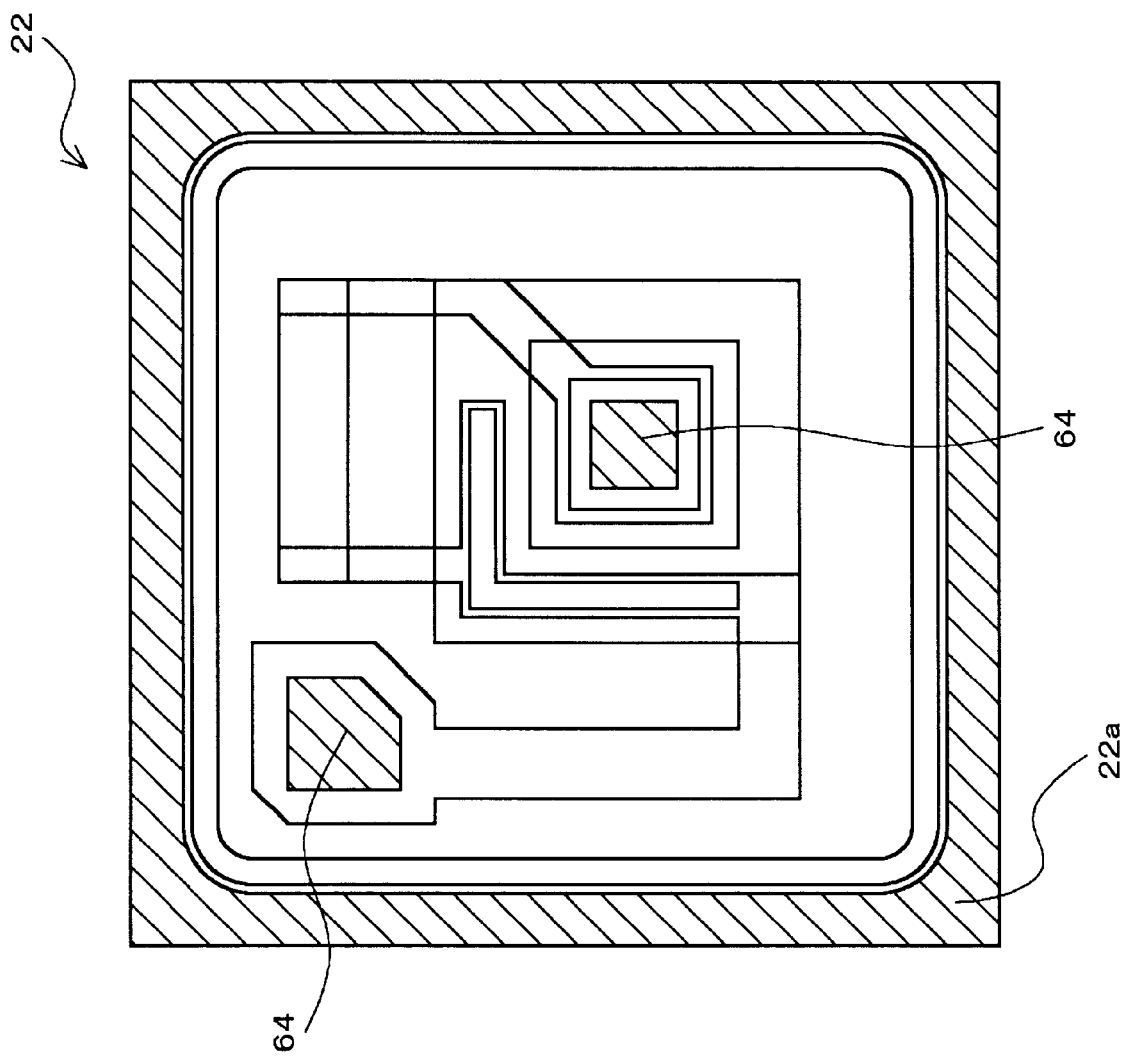
FIG. 8 is a plan view showing far another part of the manufacturing processes of the planar transistor formed on the wafer 20.

The slash lined parts shown in FIG. 8 show the parts of the silicon nitride layer 60 thus removed. In this process, another contact hole 64 for forming bonding wire (not shown) is formed as well as removing the silicon nitride layer 60 formed on a periphery part 22a of the die 22. So that, the epitaxial growth layer 42 made of silicon is exposed on the periphery part 22a of the die 22 as shown in FIG. 12A.

Figure 12A:
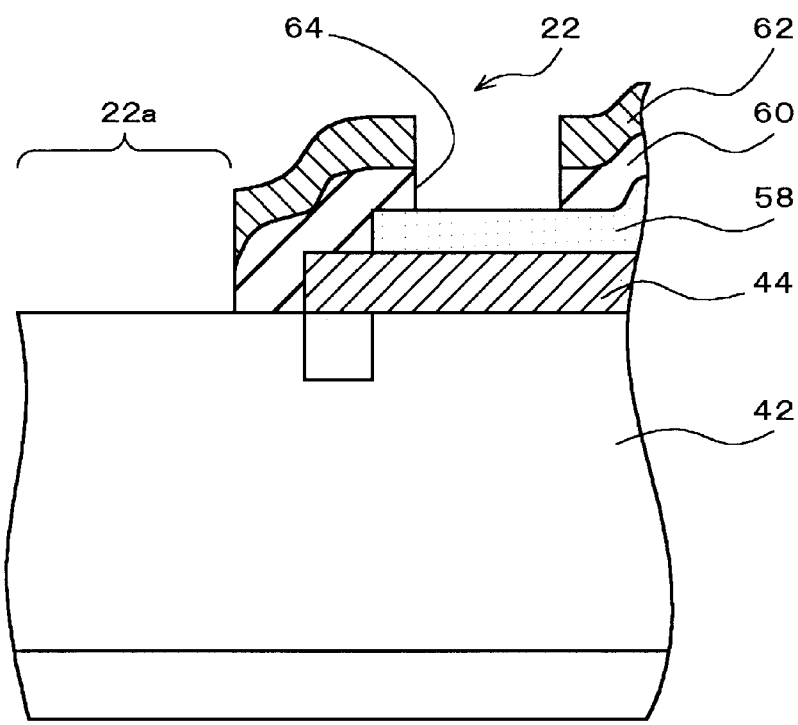
FIG. 12A is a sectional view of the wafer 20 in far another part of the manufacturing processes.
Figure 12B:
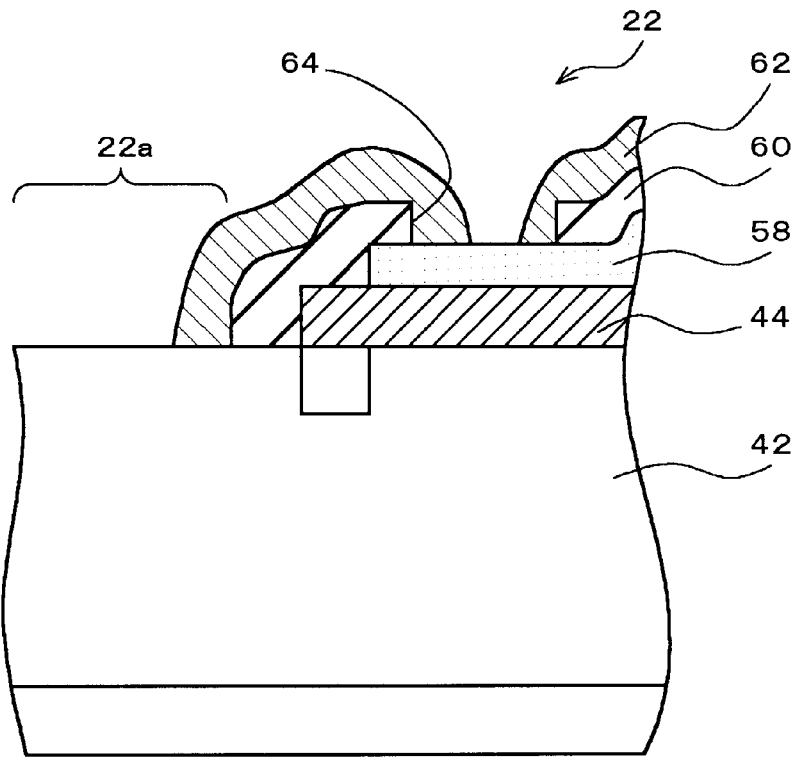
FIG. 12B is a sectional view of the wafer 20 in still another part of the manufacturing processes.

Next, the wafer 20 is heated as the condition shown in FIG. 12A. In other words, heat treatment is carried out to the wafer 20 which remains the resist layer 62 used at the process shown in FIG. 12A. By carrying out the heat treatment, a part of the periphery part 22a of the die 22 is covered with the resist layer 62 dissolved by the heat as shown in FIG. 12B.

Layers with hatching illustrated in FIG. 10 shows the resist layer 62 before carrying out the heat treatment. The resist layer 62 expands its area to the broken lines shown in FIG. 10. In this embodiment, corners 62a of the resist layer 62 located vicinity of the intersections 34 are formed in circular arc shape by carrying out patterning. As a result, the resist layer 62 expands uniformly toward normal lines of the corners 62a being formed in circular arc shape.

Figure 13A:
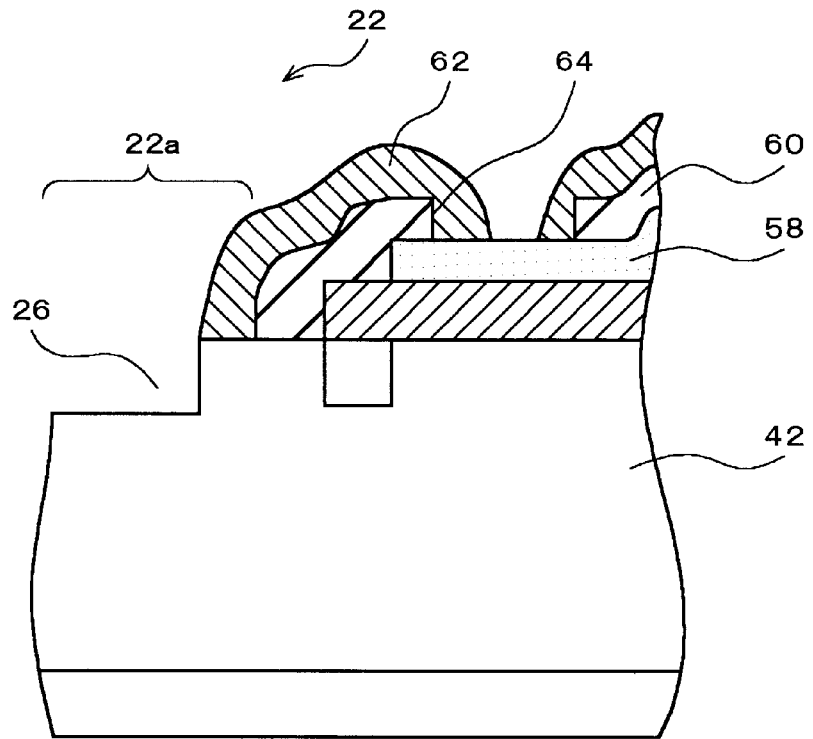
FIG. 13A is a sectional view of the wafer 20 in another part of the manufacturing processes.

Thereafter, etching is carried out utilizing the resist layer 62 expanded by the heat as a mask as shown in FIG. 13A. In this process, the cutting grooves 26 (see FIG. 2) are formed by removing the epitaxial growth layer 42 for predetermined depth in a part of the periphery part 22a of the die 22. Although, the aluminum layers 58 are exposed from a part of the contact holes 64, the aluminum layers 58 are not etched so much because etching rate of aluminum is much less than that of silicon.

Figure 9:
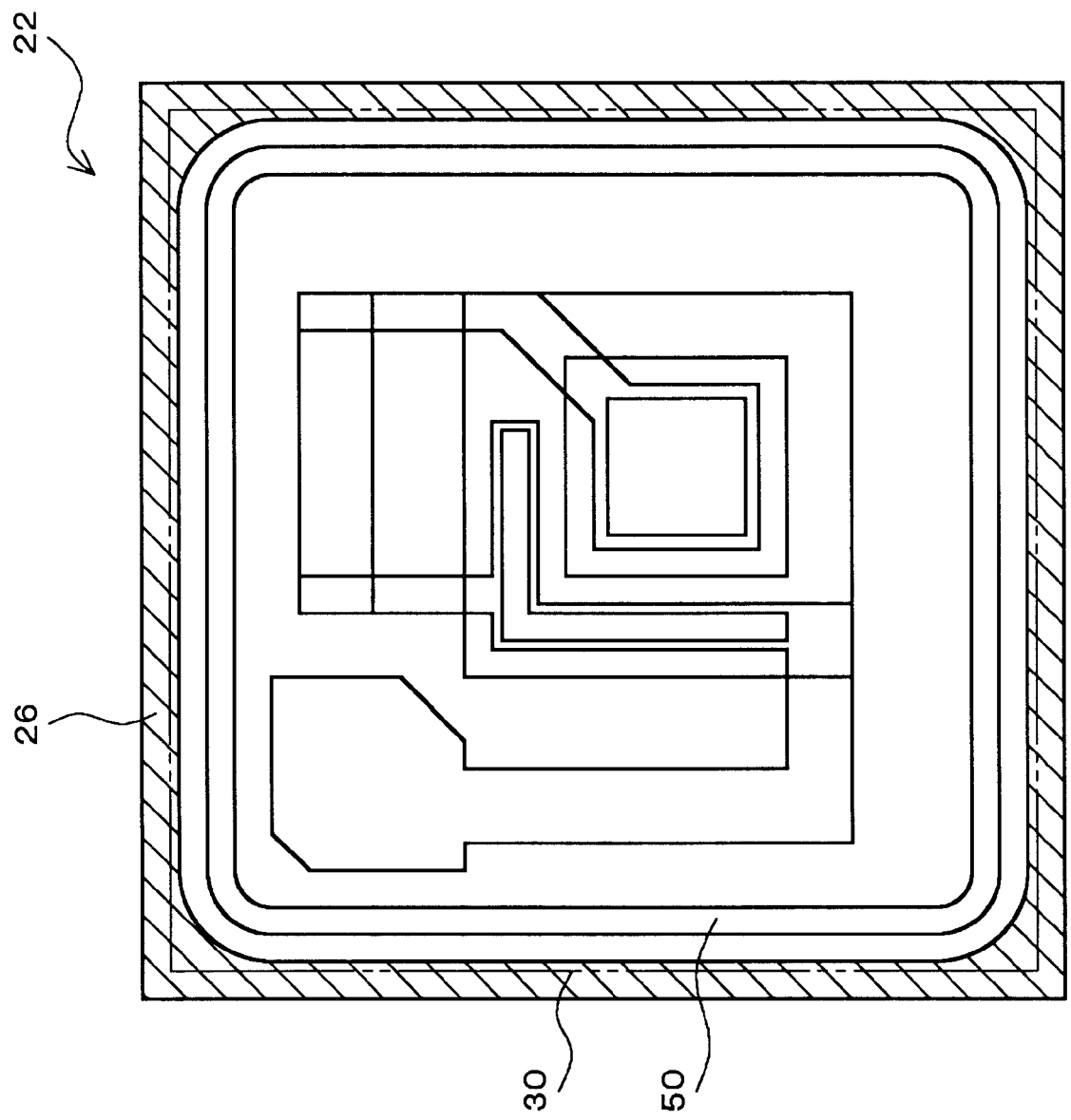
FIG. 9 is a plan view showing still another part of the manufacturing processes of the planar transistor formed on the wafer 20.
Figure 10:
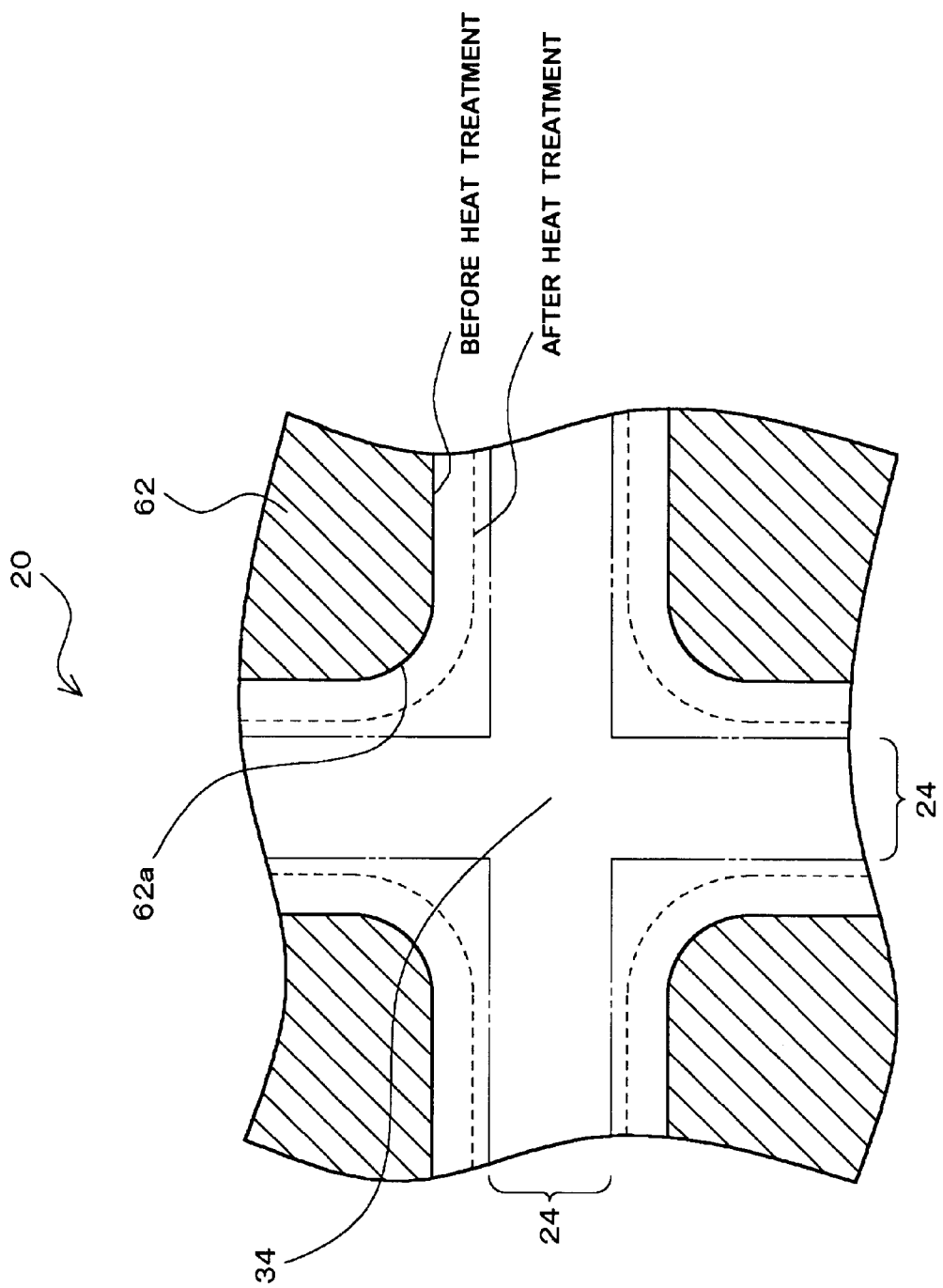
FIG. 10 is a partial enlarged plan view of the wafer 20 in a part of the manufacturing processes.
Figure 13B:
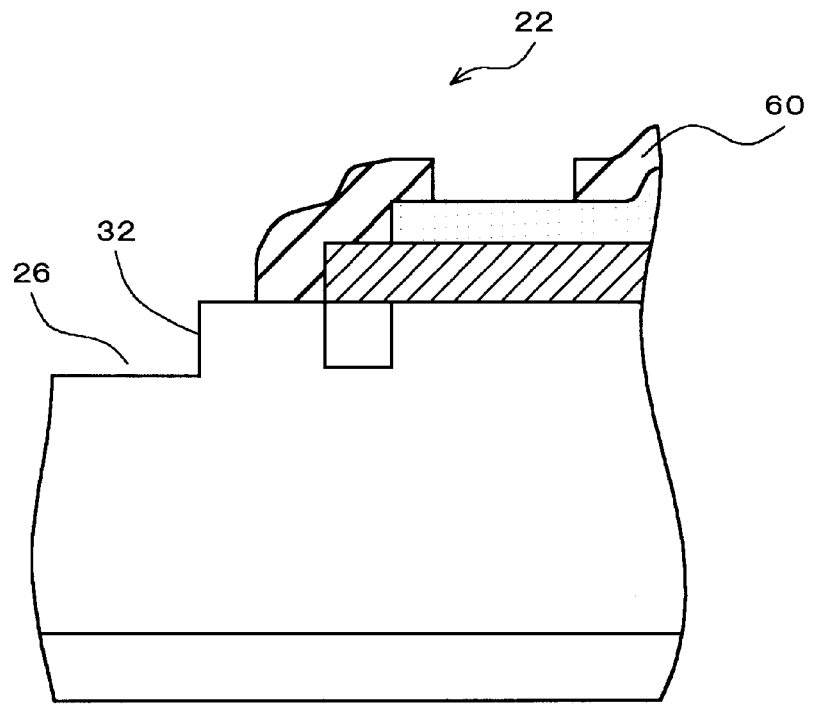
FIG. 13B is a sectional view of the wafer 20 in far another part of the manufacturing processes.
Figure 14A:
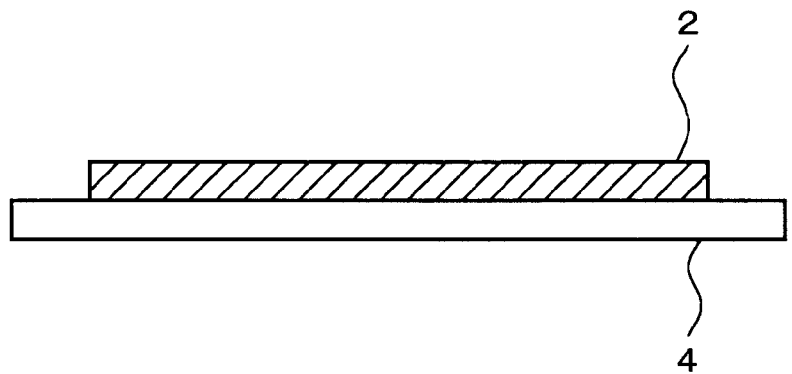
FIG. 14A is a sectional view showing a process for cutting out the dies from the wafer (when full cutting method is carried out).
Figure 14B:
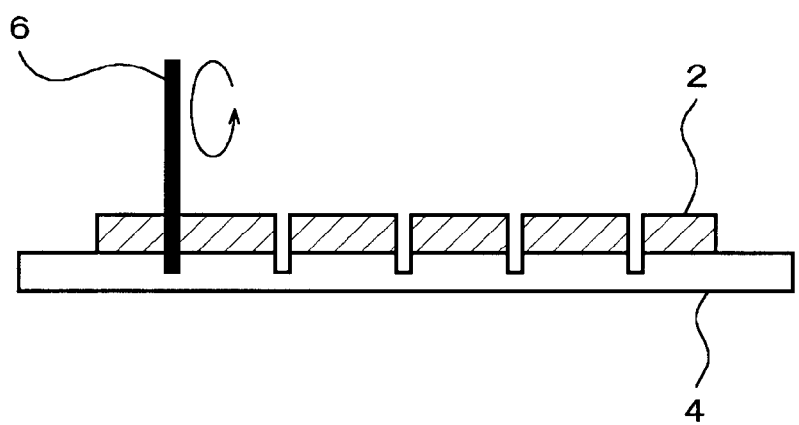
FIG. 14B is another sectional view showing the process for cutting out the dies from the wafer (when full cutting method is carried out).
Figure 15:
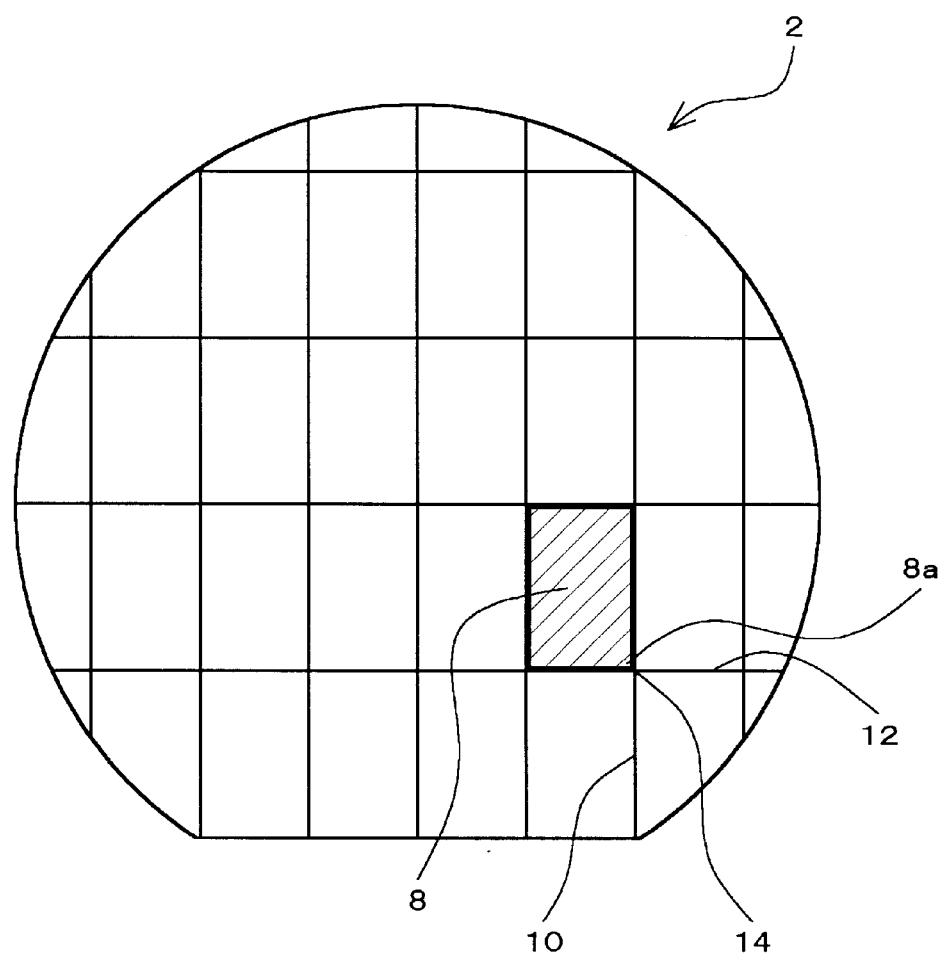
FIG. 15 is a plan view showing the process for cutting out the dies from the wafer.
Figure 16:
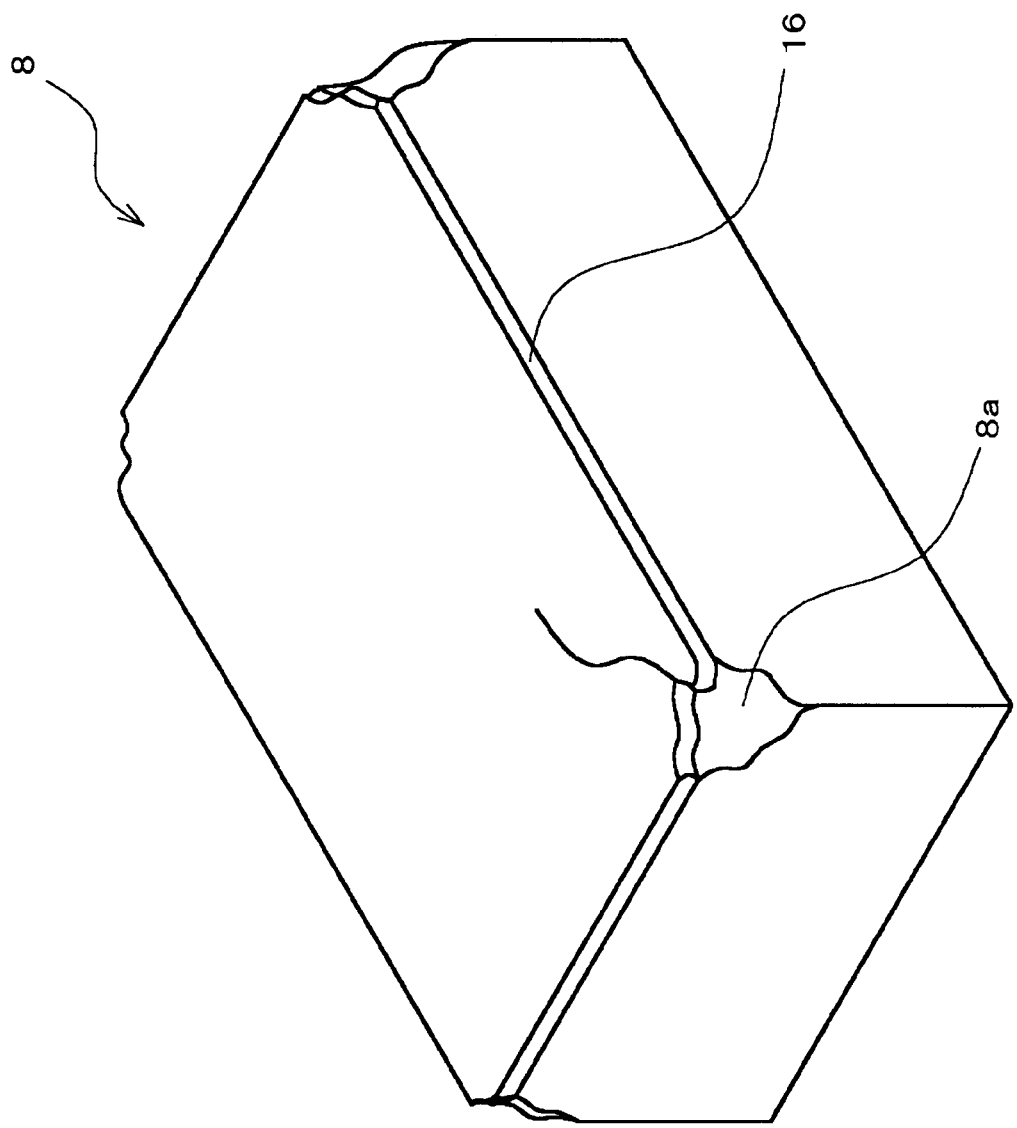
FIG. 16 is a perspective view showing a die being cut out from the wafer.

The slash lined part in FIG. 9 is shown as the cutting grooves 26 thus formed. Upon forming the cutting grooves 26, the resist layer 62 is removed as shown in FIG. 13B. All the elements which consist the planar transistor including the guard ring 50 are arranged so as to be located at the inside of the cutting grooves 26.

Next, the wafer 20 is cut along with the center of the cutting grooves 26 by the dicing saw (not shown) having a narrower width than that of the cutting grooves 26 as shown in FIG. 1. So that, the width of the scribing lines 24 is narrower than that of the cutting grooves 26, and there is only a slight probability of contact of the dicing saw with the walls 32 formed within the cutting grooves 26. Therefore, it is possible to prevent chips of the upper part of the dies 22 caused by a blade of the dicing saw. Thus, accuracy of dicing can be increased remarkably by forming the cutting grooves 26. So that, it is not necessary to change the width of the dicing saw even when spaces lain between dies 22 located adjacently are made under narrower width than usual for cutting out as many as dies 22 as possible from the wafer 20. In other words, it is not necessary to change the blade of the dicing saw to another blade having narrower width even when margins of scribing lines 24 must be narrower than usual width.

Dies 22 are cut out from the wafer 20 by carrying out dicing with the dicing saw so as to cut along the cutting grooves 26 extended on the surface of the wafer 20 to both the longitudinal direction and the transverse direction as shown in FIG. 2.

As described above, the walls 32 formed within the cutting grooves 26 intersected with each other are connected at the connection parts 32a located in the vicinity of the intersections 34, and the connection parts 32a are formed in circular arc shape. In other words, the walls 32 formed within the cutting grooves 26 are located further apart from the scribing lines 24 in the vicinity of the intersections 34. So that, the blade of the dicing saw is never contacted with the connection parts 32a of the walls 32 formed within the cutting grooves 26 in the vicinity of the intersections 34 of the scribing lines 24. Therefore, it is possible to prevent chips at the corners of the upper part of the dies 22 where it is easy to be broken while the dicing process is carried out.

In the embodiment described earlier, the connection parts 32a of the walls 32 formed within the cutting grooves 26 are formed in circular arc shape. However, the connection parts 32a of the walls 32 being formed in the cutting grooves 26 can be formed in elliptic arc shape or a curve of secondary degree such as hyperbola and a curve of more than cubic degree. In addition, the connection parts 32a can also be formed with more than two straight lines or one straight line in chamfered edge.

Although, the cutting grooves are formed by carrying out etching using a resist layer which is expanded by the heat treatment carried out at the process before the process for forming the cutting grooves as a mask in the embodiment described earlier, it is possible to form the cutting grooves by carrying out an independent process without using the resist layer used at the process before in the embodiment described above.

Further, in the embodiment described above, the width of the cutting grooves located in the vicinity of intersections of the cutting grooves is made wider than that of the cutting grooves located apart from the intersections. However, the width of the cutting grooves located in the vicinity of intersections of the cutting grooves can be made substantially equal to that of the cutting grooves located apart from the intersections.

Although, the set back faces are formed to all around the side ways on an upper part of the semiconductor chips in the embodiment described above, it is not necessary to form the set back faces to all around the side ways of the semiconductor chips. For instance, the set back faces can be only formed to corners of the semiconductor chips. Also, the set back faces can be formed to other than the upper part of the side ways.

Further, in the embodiment described earlier, the present invention is applied to a planar transistor. However, application of the present invention is not limited to the planar transistor, and the present invention can also be applied to transistors other than the planar transistor, and all kinds of semiconductor chips such as Integrated-Circuits (ICs), Large-Scale-Integrated-Circuits (LSIs).

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for manufacturing a semiconductor chip having a process for cutting out the semiconductor chip from a wafer for semiconductor, wherein a process for forming cutting grooves having wider width than a cutting trace made by a cut-off tool is carried out to a part of the wafer for semiconductor to be cut off before carrying out the process for cutting out the semiconductor chip from the wafer for semiconductor, wherein the cutting grooves are formed by carrying out etching using a resist layer expanded by heat treatment as a mask, and a resist layer before the expansion is used at a process carried out before the process for forming the cutting grooves, and wherein parts of a pattern of the resist layer used at the process carried out before the process for forming the cutting grooves corresponding to outlines of the cutting grooves intersected with each other are connected smoothly.

2. A method for manufacturing a semiconductor chip in accordance with claim 1, wherein semiconductor elements which compose the semiconductor chip are arranged so as to be in a vicinity of and inside of the cutting grooves of the semiconductor chip.

3. A method for manufacturing a semiconductor chip in accordance with claim 1, wherein the parts of the pattern of the resist layer used at the process carried out before the process for forming the cutting grooves corresponding to the outlines of the cutting grooves intersected with each other are connected to form a substantially circular arc.

* * * * *